(12) United States Patent
Willer et al.

(10) Patent No.: US 7,785,953 B2
(45) Date of Patent: Aug. 31, 2010

(54) METHOD FOR FORMING TRENCHES ON A SURFACE OF A SEMICONDUCTOR SUBSTRATE

(75) Inventors: Josef Willer, Riemerling (DE); Michael Specht, München (DE); Christoph Friederich, München (DE); Doris Keitel-Schulz, Höhenkirchen (DE)

(73) Assignee: Qimonda AG, Munich (DE)

( * ) Notice: Subject to any disclaimer, the term of this patent is extended or adjusted under 35 U.S.C. 154(b) by 91 days.

(21) Appl. No.: 12/112,379

(22) Filed: Apr. 30, 2008

(65) Prior Publication Data
US 2009/0273017 A1 Nov. 5, 2009

(51) Int. Cl.
*H01L 21/8238* (2006.01)
(52) U.S. Cl. ................ 438/201; 438/211; 257/314; 257/315
(58) Field of Classification Search ......... 257/314–317; 438/201, 211, 257, 593
See application file for complete search history.

(56) References Cited

U.S. PATENT DOCUMENTS

| 7,452,766 | B2 * | 11/2008 | Aritome | 438/211 |
| 2007/0218619 | A1 * | 9/2007 | Cha et al. | 438/201 |
| 2007/0278565 | A1 * | 12/2007 | Tu et al. | 257/330 |
| 2009/0315096 | A1 * | 12/2009 | Wei et al. | 257/315 |

* cited by examiner

*Primary Examiner*—Thanh V Pham
*Assistant Examiner*—Errol Fernandes
(74) *Attorney, Agent, or Firm*—Coats & Bennett, P.L.L.C.

(57) ABSTRACT

A method for forming trenches on a surface of a semiconductor substrate is described. The method may include: etching a first plurality of trenches into the surface of the semiconductor substrate; filling the first plurality of trenches with at least one material; and etching a second plurality of trenches into every second trench of the first plurality of trenches. Furthermore, a method for forming floating-gate electrodes on a semiconductor substrate and an integrated circuit is described.

10 Claims, 19 Drawing Sheets

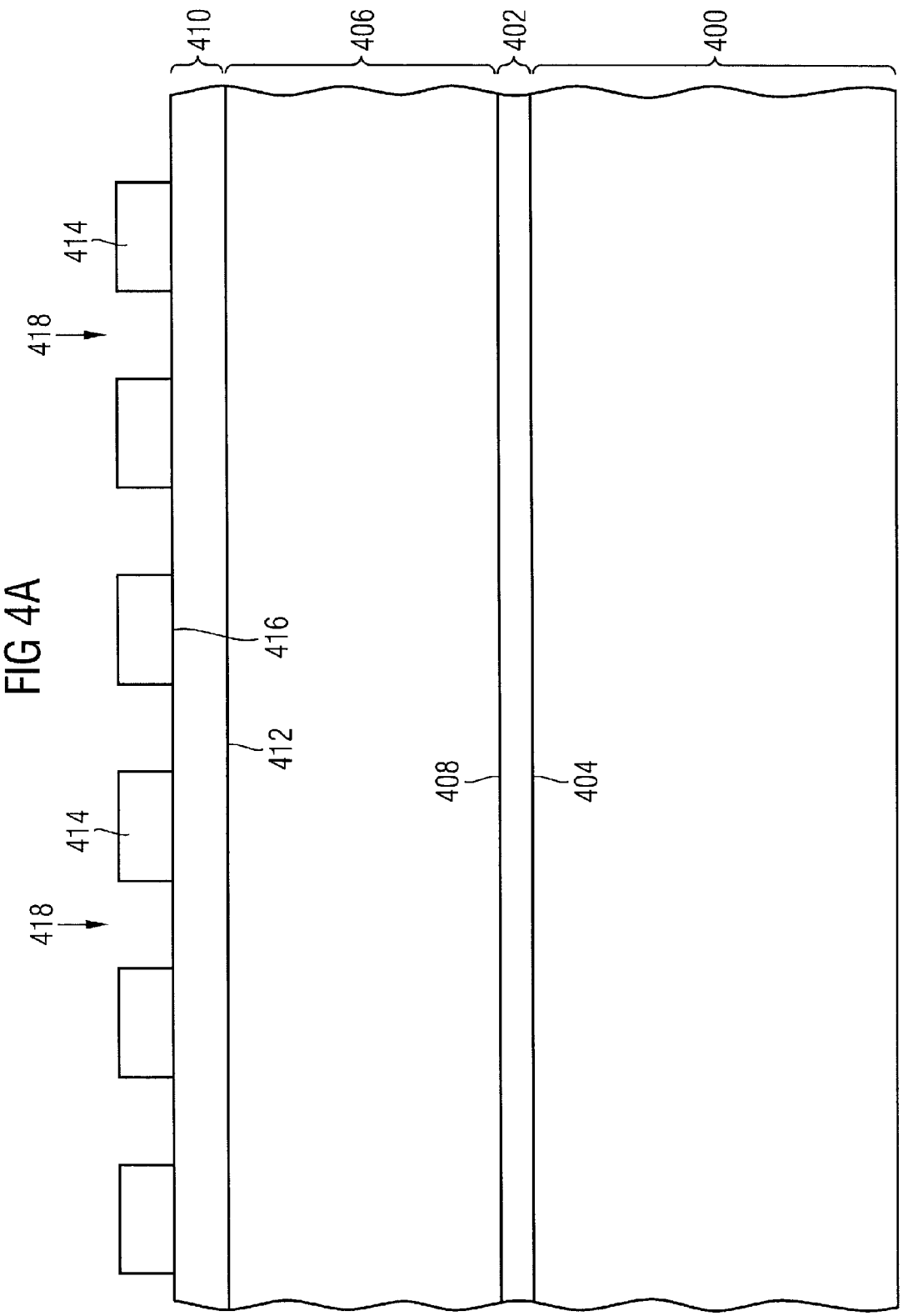

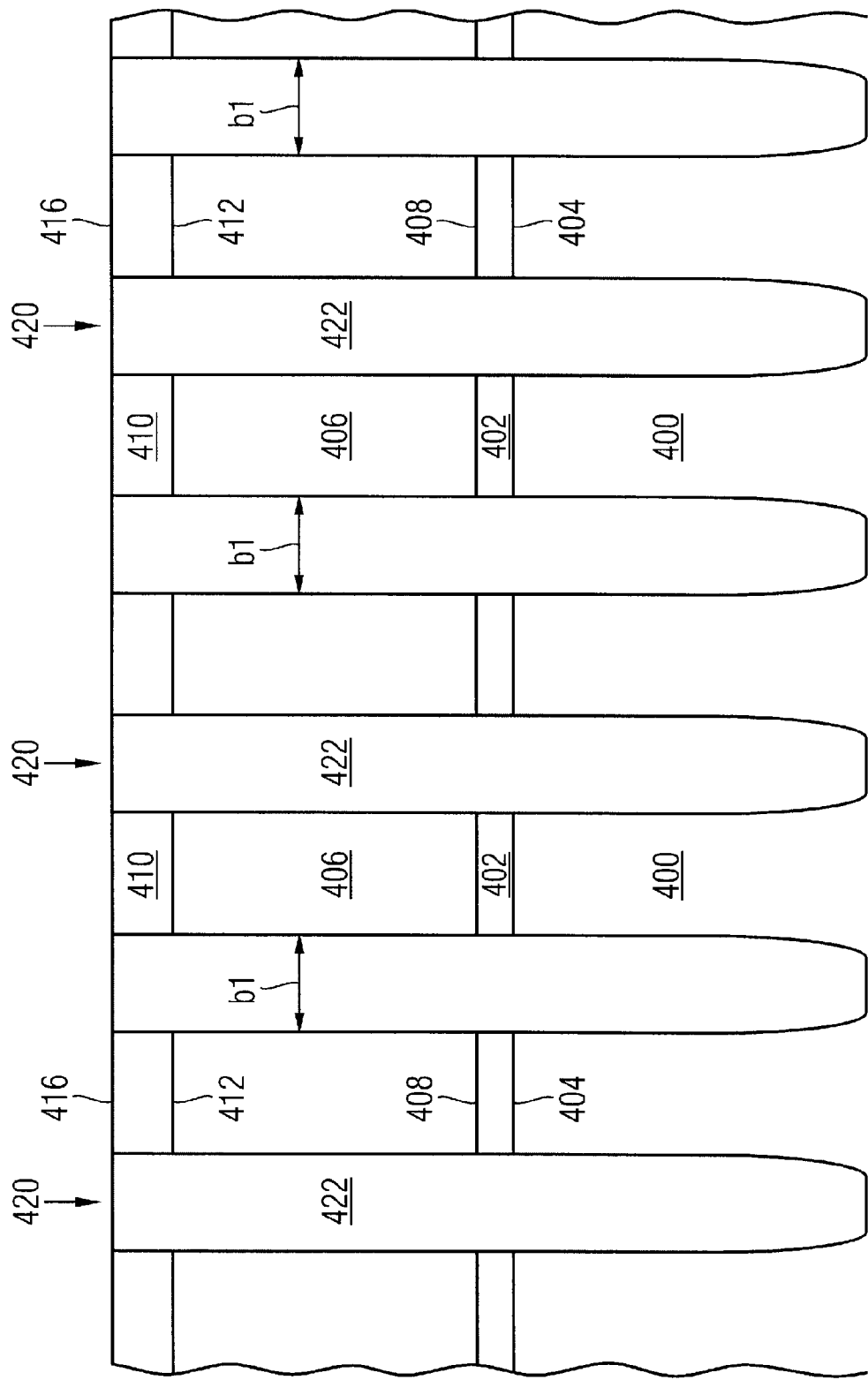

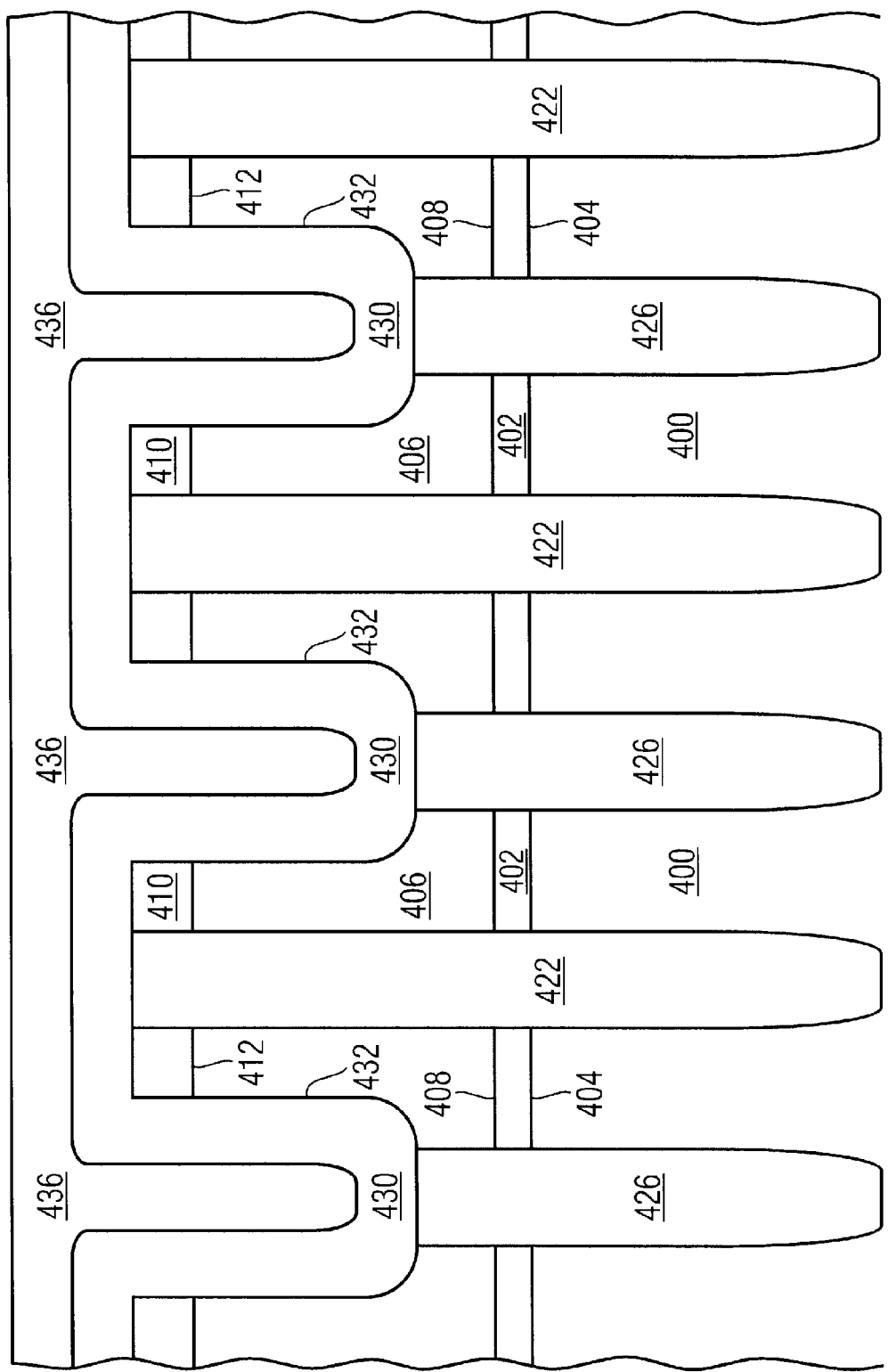

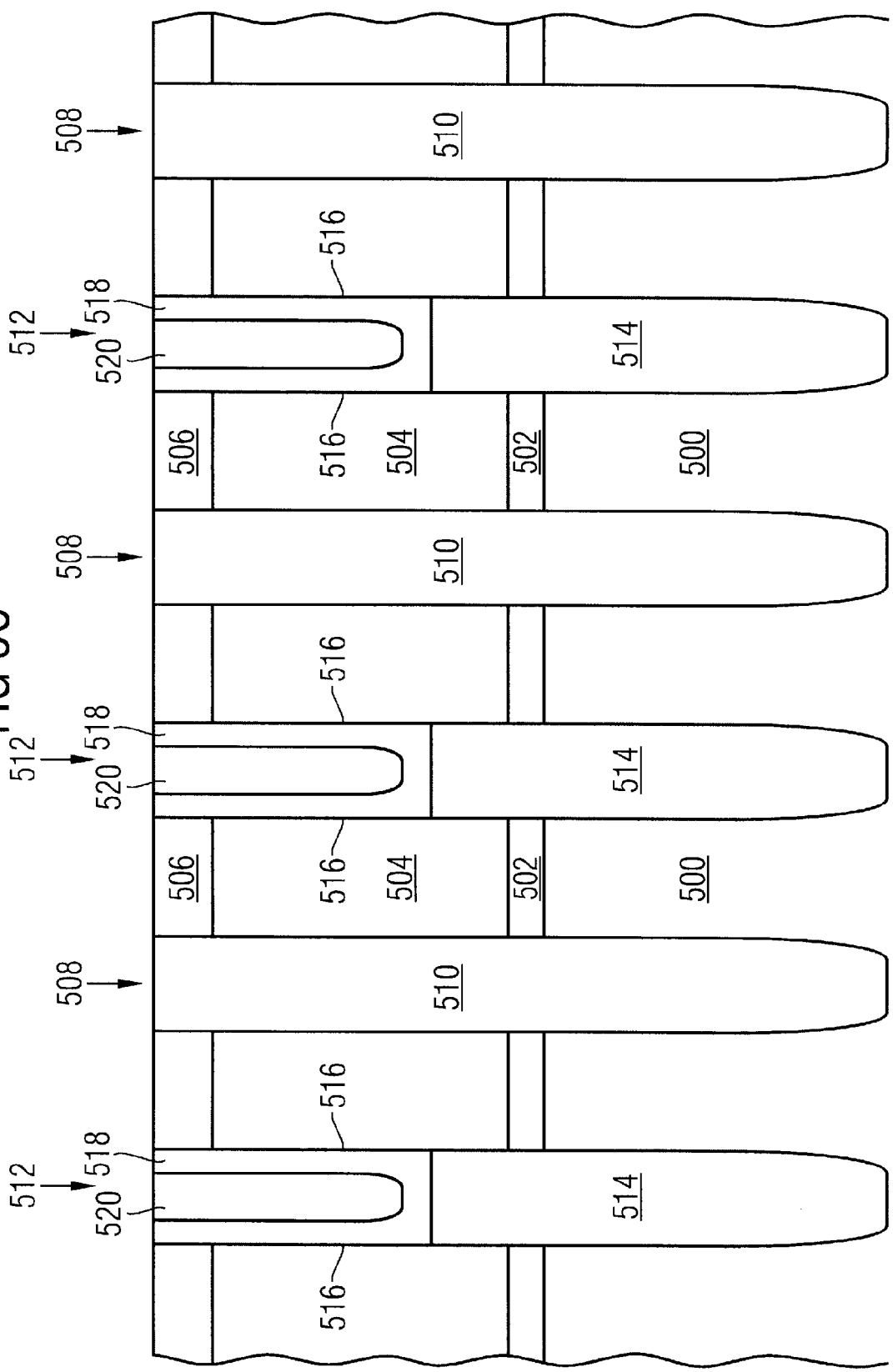

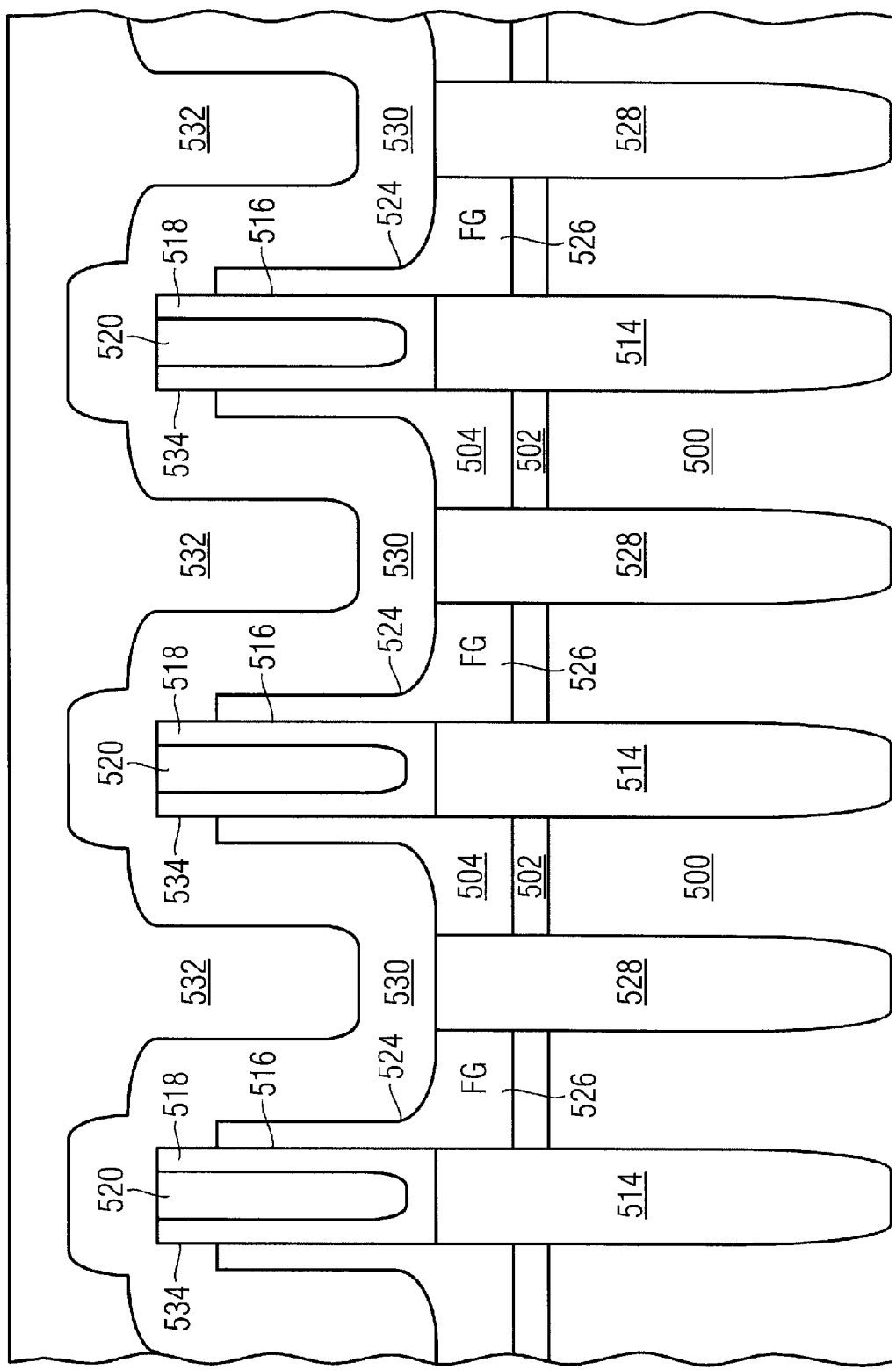

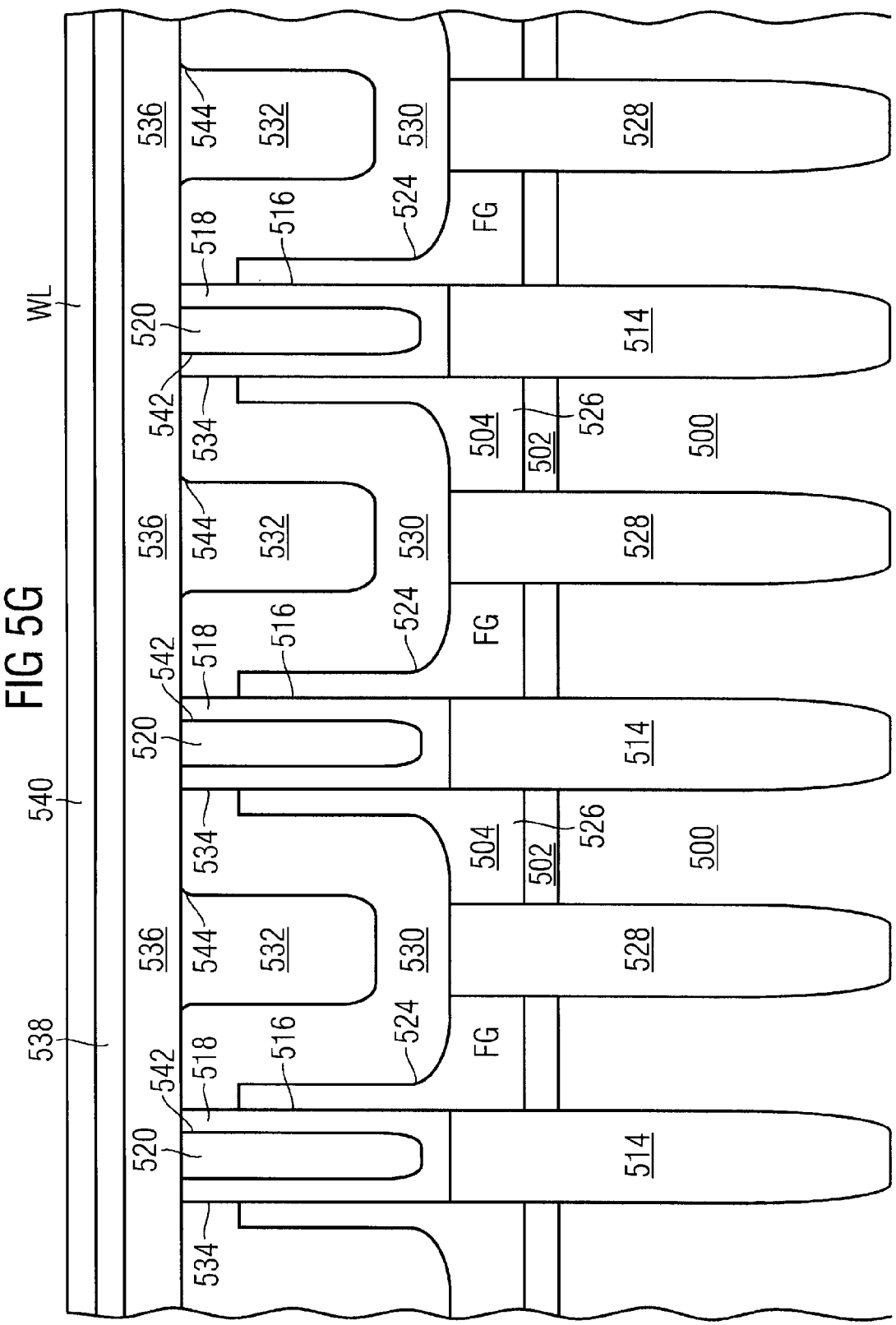

METHOD FOR FORMING TRENCHES ON A SURFACE OF A SEMICONDUCTOR SUBSTRATE

BACKGROUND OF THE INVENTION

1. Field of the Invention

This invention relates generally to a method for forming trenches on a surface of a semiconductor substrate. Furthermore, the invention also relates to a method for forming floating-gate electrodes on a semiconductor substrate and to a corresponding integrated circuit.

2. Related Art

The fabrication of a semiconductor device often comprises the formation of a relatively high number of oriented trenches within a relatively small area. For example, to fabricate an integrated semiconductor circuit with a relative high density of transistors, it is necessary to etch a plurality of parallel insulation trenches into the surface of the semiconductor substrate with a relative small distance between two adjacent trenches.

SUMMARY

A method for forming trenches on a surface of a semiconductor substrate is described. The method may include: etching a first plurality of trenches into the surface of the semiconductor substrate; filling the first plurality of trenches with at least one material; and etching a second plurality of trenches into every second trench of the first plurality of trenches.

Additionally, a method for forming floating-gate electrodes on a semiconductor substrate is described. The method may include: depositing a layer of dielectric material on a surface of the semiconductor substrate; depositing a layer of material for floating-gate electrodes on the layer of dielectric material; etching a first plurality of trenches; filling the first plurality of trenches at least partially with an insulating material to form insulation trenches; etching a second plurality of trenches to shape a first side wall of a plurality of floating-gate electrodes, the first side wall running parallel to the longitudinal direction of the insulation trenches; covering the first side wall at least partially with a first layer; and etching a third plurality of trenches to shape a second side wall of the plurality of floating-gate electrodes, so that each floating-gate electrode of the plurality of floating-gate electrodes comprises one first side wall and one second side wall opposing the first side wall.

Furthermore, an integrated circuit is described. The integrated circuit may comprise: a layer of dielectric material covering a surface of a semiconductor substrate at least partially; a plurality of insulation trenches formed within the surface of the semiconductor substrate; and a plurality of floating-gate electrodes, each floating-gate electrode of the plurality of floating-gate electrodes having a first side wall running parallel to the longitudinal direction of the insulation trenches and a second side wall opposing the first side wall, wherein the first side wall is covered at least partially by a first layer and the second side wall is covered at least partially by a second layer, such that an interface is formed between the first layer and the second layer.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood by referring to the following figures. The components in the figures are not necessarily to scale, emphasis instead being placed upon illustrating the principles of the invention.

FIGS. 4A to 4I show cross-sectional views of a semiconductor device to describe another approach of an implementation of a method for forming floating-gate electrodes.

FIGS. 5A to 5G show cross-sectional views of a semiconductor device to describe another approach of an implementation of a method for forming floating-gate electrodes.

DETAILED DESCRIPTION

In the following description, reference is made to the accompanying drawings that form a part hereof, and in which is shown by way of illustration one or more specific implementations in which the invention may be practiced. It is to be understood that other implementations may be utilized and structural changes may be made without departing form the scope of this invention.

Figure 1:
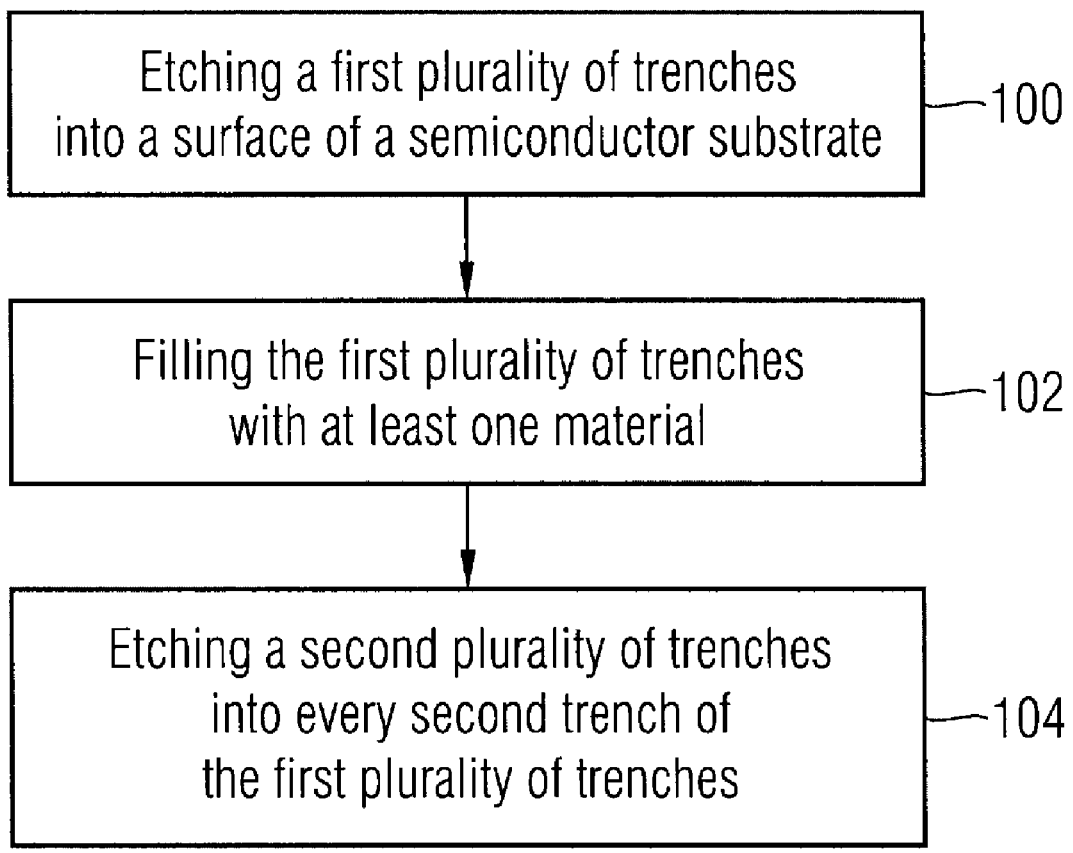
FIG. 1 is a flowchart showing an example of an implementation of a method for forming trenches on a surface of a semiconductor substrate.

FIG. 1 is a flowchart showing an example of an implementation of a method for forming trenches on a surface of a semiconductor substrate.

As an example, the method may include a number of steps, e.g. etching a first plurality of trenches into a surface of a semiconductor substrate in step 100 and filling the first plurality of trenches with at least one material in step 102. For instance, a reactive ion etch ("RIE") process may be performed to etch the first plurality of trenches. The first plurality of trenches may be filled with an insulating material to provide insulation trenches. However, the technology is not restricted to an insulating material filled into the first plurality of trenches.

The method may also include etching a second plurality of trenches into every second trench of the first plurality of trenches in step 104. After the etching of the second plurality of trenches, two adjacent trenches of the second plurality of trenches may embrace one trench of the first plurality of trenches in which no trench of the second plurality is etched. The trenches of the second plurality of trenches may be less deep than the trenches of the first plurality of trenches.

As an example, an isotropic etch process may be performed to etch the second plurality of trenches. The second plurality of trenches etched by performing the isotropic etch process may be wider than the trenches of the first plurality of trenches.

Figure 2:
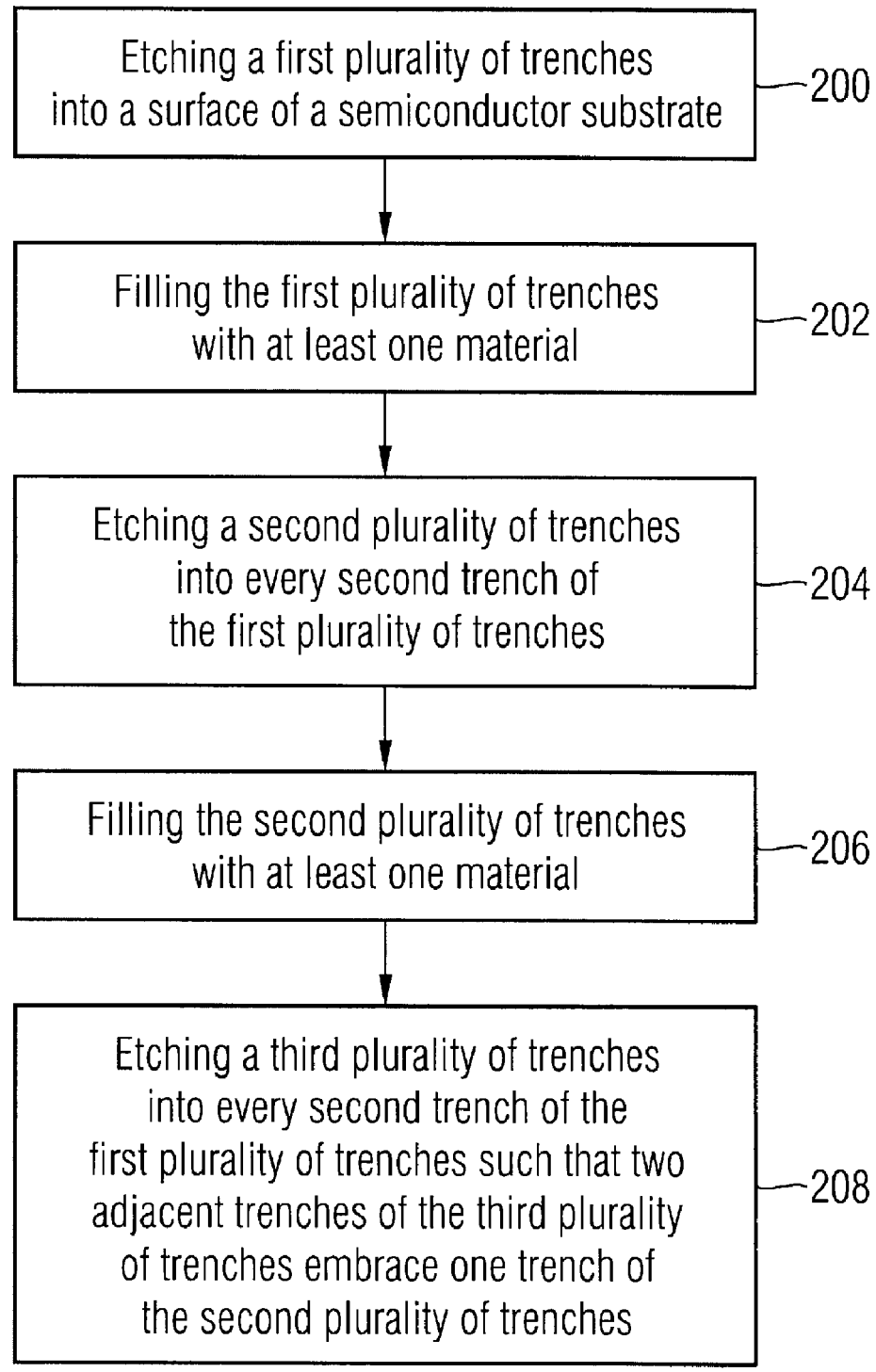
FIG. 2 is a flowchart showing another approach of an implementation of a method for forming trenches on a surface of a semiconductor substrate.

FIG. 2 is a flowchart showing another approach of an implementation of a method for forming trenches on a surface of a semiconductor substrate.

The method may include the steps of etching a first plurality of trenches into a surface of a semiconductor substrate (step 200) and filling the first plurality of trenches with at least one material (step 202). In step 204, a second plurality of trenches may be etched into every second trench of the first plurality of trenches. For instance, a RIE process may be performed to etch the second plurality of trenches. However, the present technology is not restricted to the RIE process for etching the second plurality of trenches. It is also possible to perform an isotropic etch process to etch the second plurality of trenches.

The second plurality of trenches may be filled with at least one material (step 206). The material filled into the second plurality of trenches may differ from the material filled into the first plurality of trenches. For instance, a first layer of a first coupling-dielectric material may be formed to cover the side walls and the bottoms of the second plurality of trenches. Furthermore, the first layer of the first coupling-dielectric material may be covered at least partially by a first layer of material for control-gate electrodes.

Moreover, the method may also include etching a third plurality of trenches into every second trench of the first plurality of trenches in step 208. After step 208, two adjacent trenches of the third plurality of trenches may embrace one trench of the second plurality of trenches.

The trenches of the third plurality of trenches may be etched wider than the trenches of the second plurality of trenches. However, it is possible to form trenches for the third plurality of trenches that have the same breadth than the trenches of the second plurality of trenches.

For instance, an isotropic etch process may be performed to etch the third plurality of trenches. The trenches of the third plurality of trenches may be etched as deep as the trenches of the second plurality of trenches.

In a not shown step, the third plurality of trenches may be filled at least partially with a material. For instance, the third plurality of trenches may be filled with a second layer of a second coupling-dielectric material and a second layer of material for the control-gate electrodes. The second coupling dielectric material may differ from the first coupling-dielectric material. However, it is also possible to cover the side walls and the bottoms of the third plurality of trenches at least partially with the first coupling-dielectric material.

Figure 3:
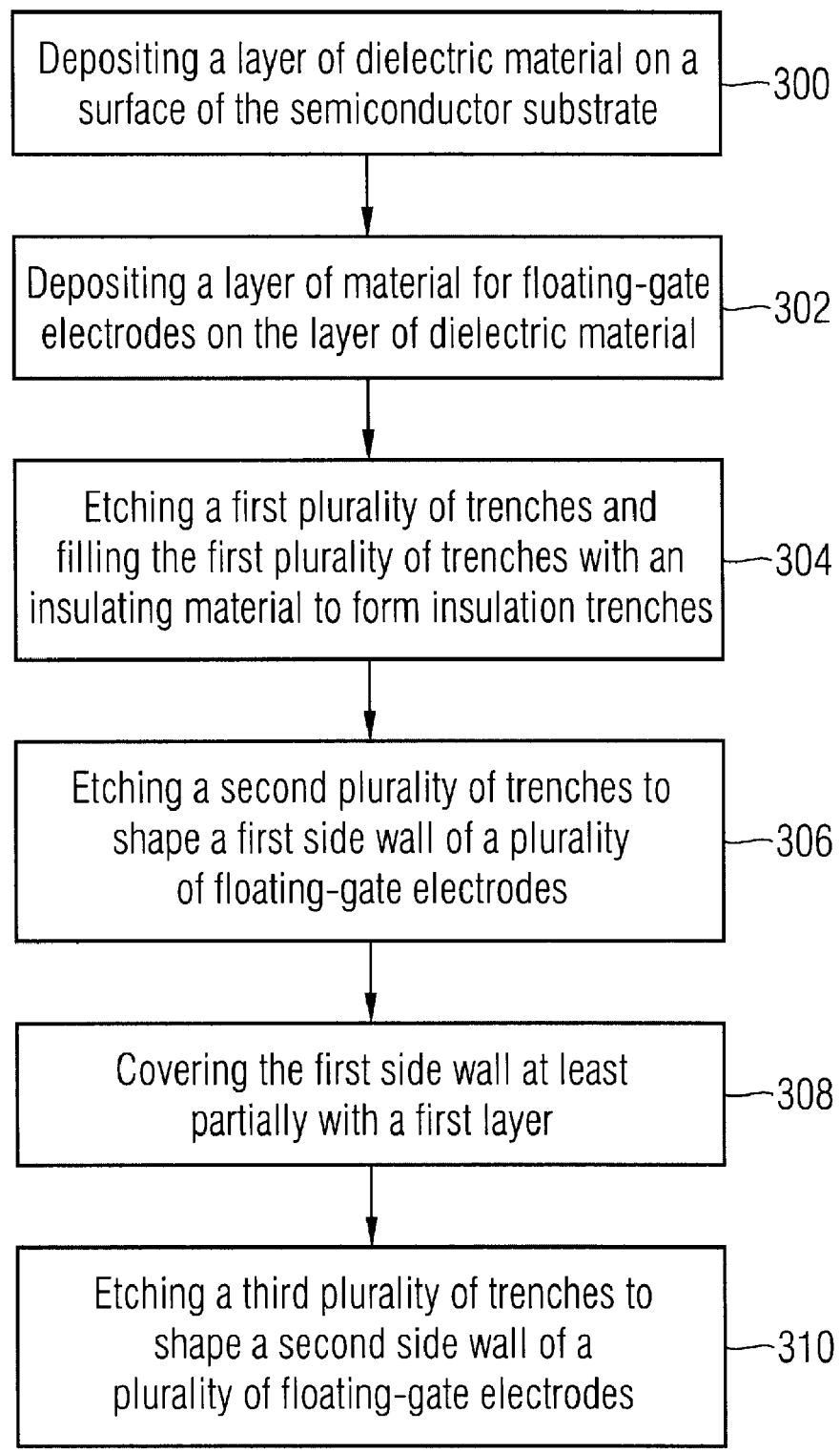
FIG. 3 is a flowchart showing an example of an implementation of a method for forming floating-gate electrodes on a semiconductor substrate.

FIG. 3 is a flowchart showing an example of an implementation of a method for forming floating-gate electrodes on a semiconductor substrate.

The method may include a step 300 of depositing a layer of dielectric material on a surface of the semiconductor substrate. On the layer of dielectric material, a layer of material for floating-gate electrodes may be deposited to provide the material for floating-gate electrodes later to be formed (step 302). The layer of material for floating-gate electrodes may include polysilicon.

In step 304, a first plurality of trenches may be etched. The first plurality of trenches may be filled at least partially with an insulating material to form insulation trenches.

A second plurality of trenches may be etched to shape a first side wall of a plurality of floating-gate electrodes (step 306). The first side wall may be arranged parallel to the longitudinal direction of the insulation trenches. Each trench of the second plurality of trenches may be etched into every second trench of the first plurality of trenches.

In another process step 308, the first side wall may be covered at least partially with a first layer. The first layer may include a first coupling-dielectric material. Furthermore, a first layer of material for the control-gate electrodes may be formed on the first layer to fill the second plurality of trenches. However, the present technology is not restricted to these materials.

A third plurality of trenches may be etched to shape a second side wall of the plurality of floating-gate electrodes (step 310). The second side wall may be arranged in an opposite direction with regard to the first side wall. Each trench of the third plurality of trenches may be etched such that two adjacent trenches of the second plurality of trenches embrace one trench of the third plurality of trenches.

In a not shown process step, the second side wall may be covered at least partially with a second layer such that an interface is formed between the first layer and the second layer. For instance, the second layer may comprise a second coupling-dielectric material. The second coupling-dielectric material may differ from the first coupling-dielectric material. Furthermore, the second layer may be covered at least partially with a second layer of material for the control-gate electrodes. However, the present technology is not restricted to the given examples.

FIGS. 4A to 4I show cross-sectional views of a semiconductor device to describe another approach of an implementation of a method for forming floating-gate electrodes.

In FIG. 4A, a cross-sectional view of a semiconductor substrate 400 is shown. As an example, the material of the semiconductor substrate 400 may be silicon.

An insulation layer 402 is formed on a surface 404 of semiconductor substrate 400. The insulation layer 402 may have a layer thickness of about 5-15 nm. As an example, the insulation layer 402 may be a silicon oxide layer formed by utilizing a thermal oxidation process. However, it is appreciated by those skilled in the art that there are various other insulating materials that may also be used to form the insulation layer 402.

A floating-gate layer 406 is formed on the surface 408 of the insulation layer 402. In this example, the floating-gate layer 406 may include polysilicon. The floating-gate layer 406 may have a higher layer thickness than the insulation layer 402. As an example, the thickness of the floating-gate layer 406 may be about 20-120 nm.

A nitride layer 410 is formed to cover a surface 412 of floating-gate layer 406 at least partially. A mask 414 is placed on a surface 416 of nitride layer 410. As an example, the mask 414 may be a carbon hard mask. A lithographic process may be performed to structure the mask 414. The structured mask 414 may include a plurality of mask openings 418 that expose the nitride layer 410 according to a pattern of trenches that are to be formed in the semiconductor substrate 400. The result is shown in FIG. 4A.

In FIG. 4B, a cross-sectional view of semiconductor substrate 400 is shown after the formation of a first plurality of trenches 420. For instance, a reactive ion etch ("RIE") process is performed to etch the first plurality of trenches 420 into semiconductor substrate 400.

Each trench 420 may extend through nitride layer 410, floating-gate layer 406, insulation layer 402 and into semiconductor substrate 400. For example, the depth of the trenches 420 may be 250 nm. The trenches 420 may have a first breadth b1.

The not exposed areas under mask 414 may be chosen large enough to ensure a sufficient stiffness of the interspaces between the trenches 420. Thus, the interspaces between two adjacent trenches 420 may be structurally strong enough to resist bending or breaking.

After the etching of the first plurality of trenches 420, the mask 414 may be removed. In this example, the trenches 420 become STI-trenches. Therefore, the trenches 420 are filled with an insulating material 422. For instance, the insulating material 422 may be silicon oxide. However, instead of silicon oxide numerous other types of insulating materials may be filled into the trenches 420. A chemical mechanical polishing (CMP) process may be performed to remove the insulating material 422 from the surface 416 of nitride layer 410.

The insulating material 422 filled into the trenches 420 further increases the stiffness of the newly formed structures on the surface 404 of the semiconductor substrate 400.

Figure 4C:
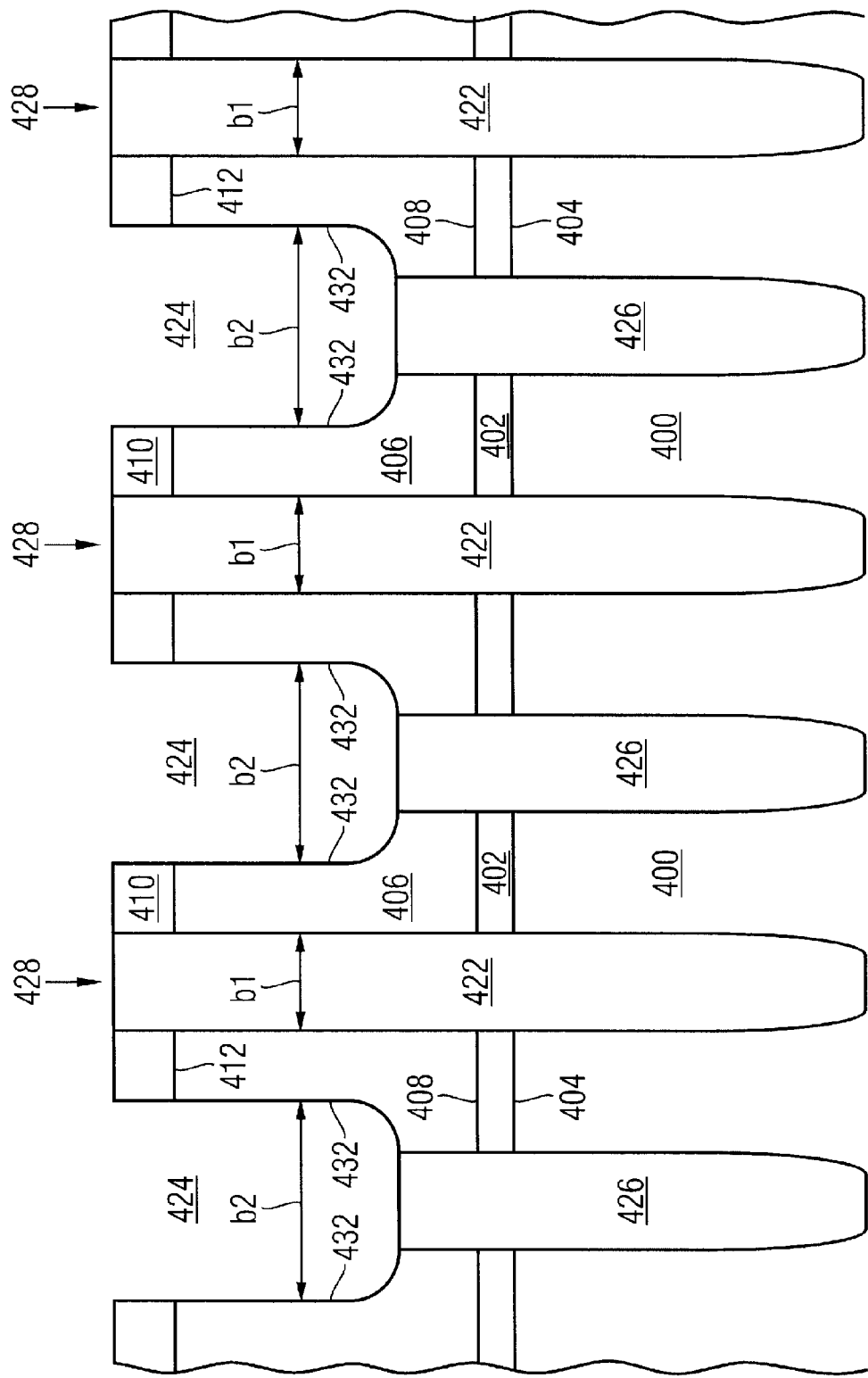

FIG. 4C shows a cross-sectional view of semiconductor substrate 400 after the formation of a second plurality of trenches 424. The trenches 424 are etched into every second trench of the first plurality of trenches. Two adjacent trenches of the second plurality of trenches 424 may embrace one trench 428 of the first plurality of trenches, which is still filled completely with the insulating material 422.

The trenches 424 may be etched by an isotropic etch process. The trenches 424 may not be etched as deep as the trenches 428. This reduces the surface of the remaining STI-fills 426 to a level above the surface 408 of the insulation layer 402. However, due to the isotropic etch process, the breadth b2 of the trenches 424 is larger than the breadth b1 of the trenches 428.

The walls of the trenches 424 define first side walls 432 of the floating-gate electrodes later to be formed. The first side walls 432 are arranged parallel to the longitudinal direction of the trenches filled with the insulating material 422 and 426. The etching of the second plurality of trenches 424 is performed to shape the first side walls 432.

A first coupling-dielectric material layer 430 is formed on the surface 416 of nitride layer 410. The first coupling-dielectric material layer 430 also covers the walls and the bottoms of the trenches 424. As an example, the first coupling-dielectric material layer 430 may be deposited by a low pressure chemical vapor deposition ("LPCVD") process. The first coupling-dielectric material layer 430 may include silicon oxide. However, instead of silicon oxide, the coupling-dielectric material layer 430 may include another dielectric material.

The first coupling-dielectric material layer 430 is covered with a first layer of material for the control-gate electrodes 436. The layer thickness of the first layer of material for the control-gate electrodes 436 is large enough to fill the remaining space of the trenches 424. The result is shown in FIG. 4D.

Figure 4E:
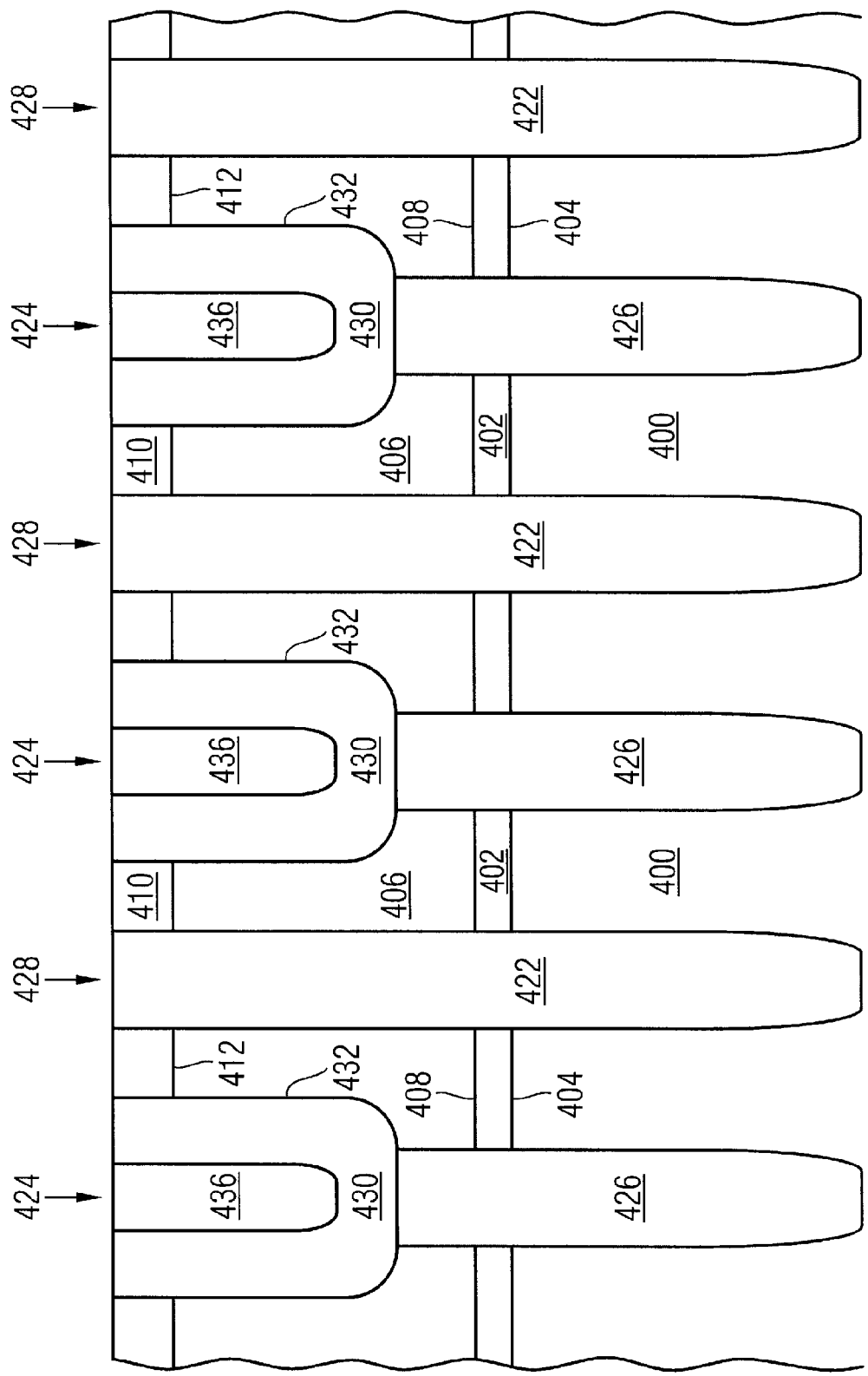

FIG. 4E shows a cross-sectional view of semiconductor substrate 400 after a CMP-process performed to the remove protruding parts of the first coupling-dielectric material layer 430 and the first layer of material for the control-gate electrodes 436. The CMP-process is performed until the nitride layer 410 is exposed again.

Another (not shown) mask is deposited on the semiconductor substrate 400. In a following lithographic process, those areas of the mask are exposed that cover the remaining trenches 428 still filled completely with the insulating material 422.

Figure 4F:
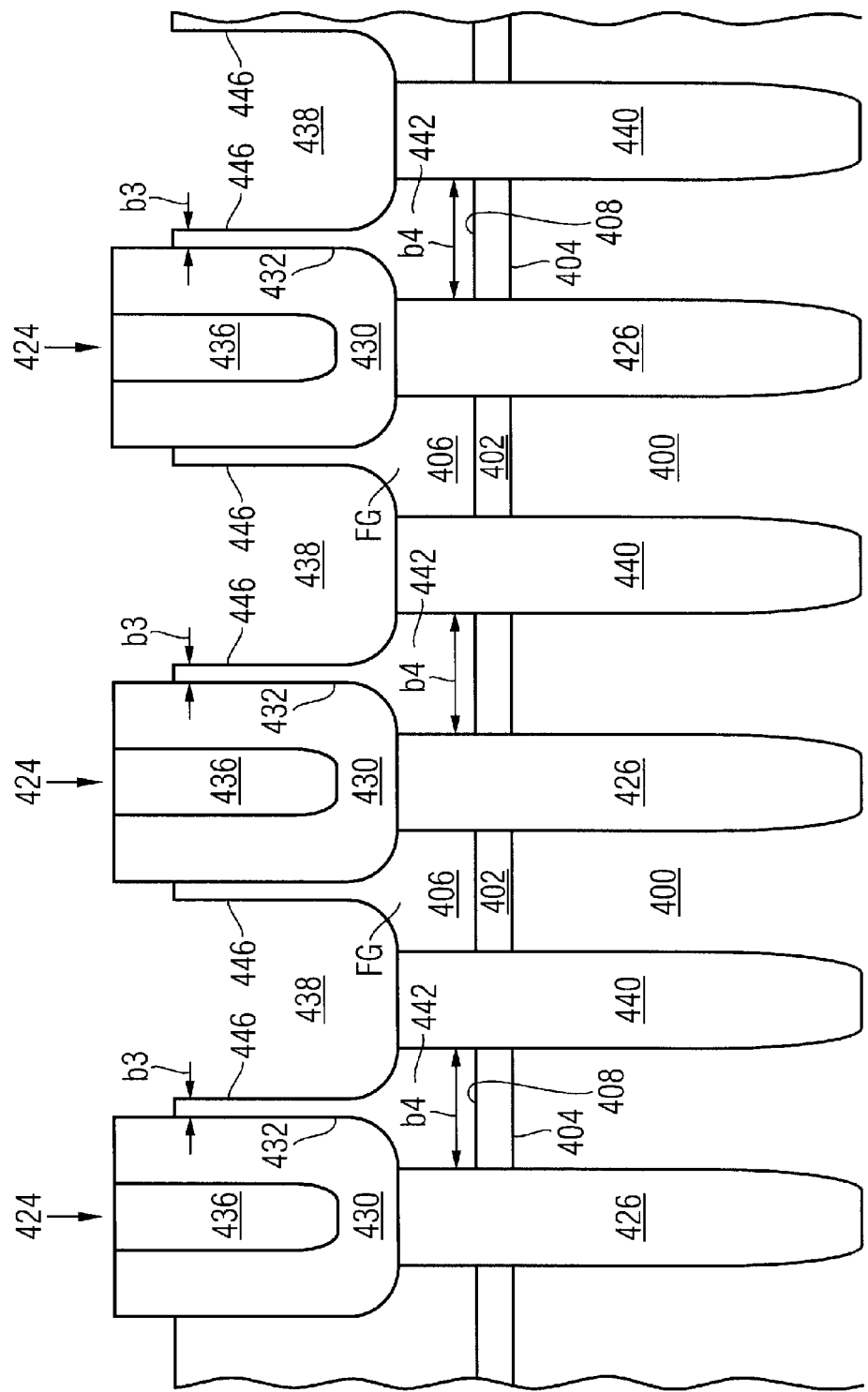

Then, using the mask, a third plurality of trenches 438 is etched into the remaining trenches 428. The trenches 438 may be etched by an isotropic etch process. This isotropic etch process may be performed until the surface of the remaining STI-fills 440 has the same height as the STI-fills 426. The trenches 438 are located such that two adjacent trenches 438 are arranged on both sides of a trench 424. The breadth of the trenches 438 may be equal to the value b2. Then, the mask and the nitride layer 410 are removed from the surface of the semiconductor substrate 400. The result is shown in FIG. 4F.

The third plurality of trenches 438 is etched to shape a second side wall 446 of a plurality of floating-gate electrodes ("FG") 442 formed of the former floating-gate layer 406. The second side walls 446 of the floating-gate electrodes are defined by the walls of the trenches 438. Each floating-gate electrode 442 has one first side wall 432 and one second side wall 446 opposing the first side wall 432.

The floating-gate electrodes 442 have an upper breadth b3 which may be about 10 nm. The lower breadth b4 of the floating-gate electrodes 442 may be in the range between 30 nm to 100 nm. This inverse T-shape of the floating-gate electrodes 442 reduces the interaction between two floating-gate electrodes 442 arranged next to each other in a direction perpendicular to the cross-section of the FIGS. 4A to 4I. The interaction between a floating-gate electrode 442 and its associated (in a following process step to be formed) control-gate electrode is not limited by the inverse T-shape of the floating-gate electrodes 442.

Due to the lower value of the upper breadth b3, the upper parts of the floating-gate electrodes 442 might start to bend or even break in a situation where both pluralities of trenches 424 and 438 are formed simultaneously. However, this risk may be avoided when the floating-gate electrodes 442 are produced by the method explained above. The floating-gate electrodes 442 produced by this method are formed in several process steps. First, the first side wall 432 of the floating gate electrodes 442 is shaped. The first side wall 432 is covered with the layers 430 and 436 before the second side wall 446 is shaped. Thus, the floating-gate electrodes 442 are in contact with at least one other layer in each process step. This contact of the floating-gate electrodes 442 with at least one other layer may provide sufficient stability to the floating-gate electrodes 442.

A second coupling-dielectric material layer 444 (such as, for example, silicon oxide) is filled into the trenches 438 to cover the walls and the bottoms of the trenches 438. The second coupling-dielectric material layer 444 is covered with a second layer of material for the control-gate electrodes 450.

Figure 4G:
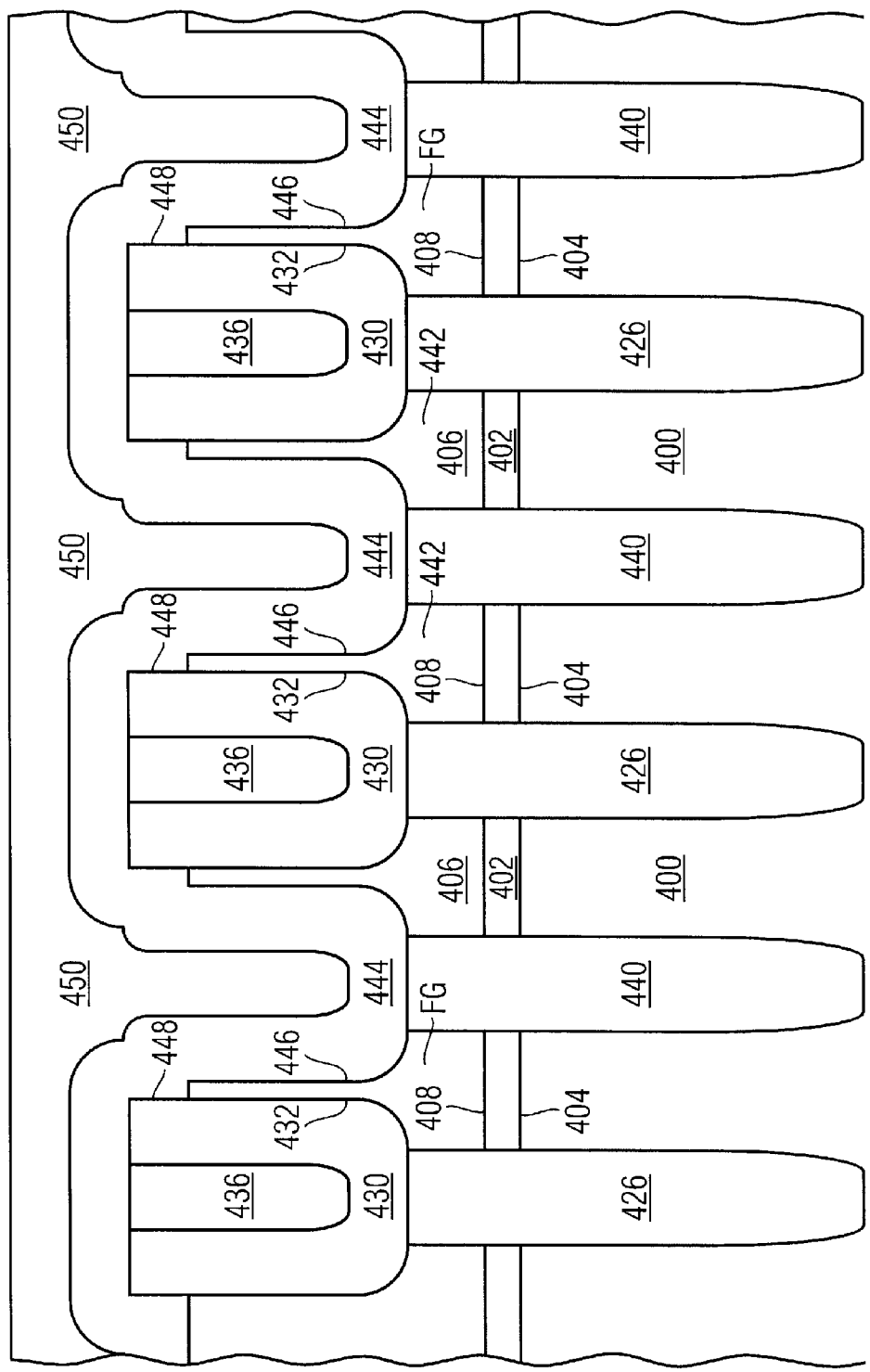

The result is shown in FIG. 4G. The second coupling-dielectric material layer 444 covering the second side walls 446 has an interface 448 with the first coupling-dielectric material layer 430 covering the first side walls 432. Even though both layers 430 and 444 may include the same coupling-dielectric material, there is still the interface 448 provided between the two layers 430 and 444.

Figure 4H:
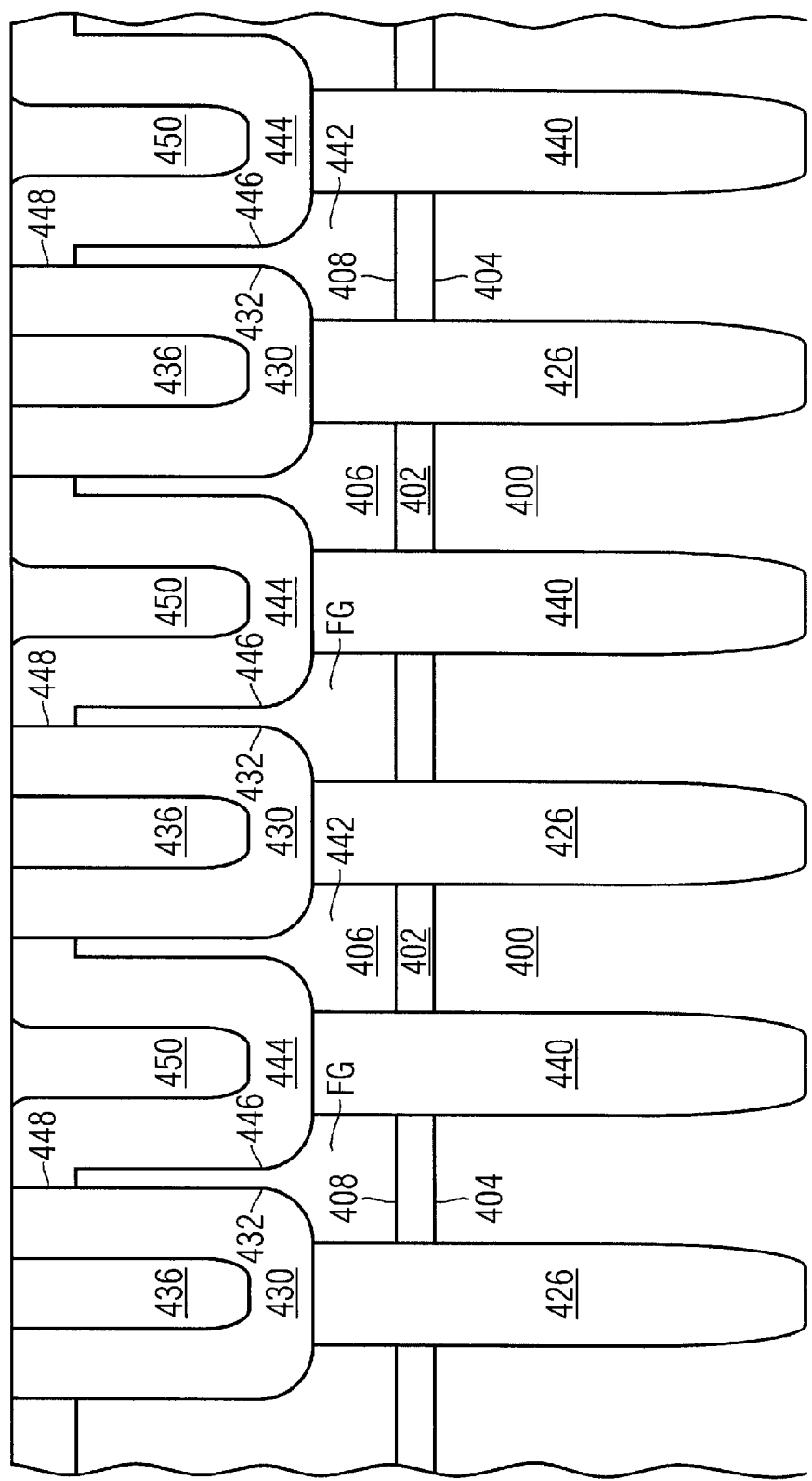

In FIG. 4H, a cross-sectional view of the semiconductor substrate 400 after a CMP-process is shown. The CMP-process is performed to remove protruding parts of the second coupling-dielectric material layer 444 and the second layer of material for the control-gate electrodes 450.

The size of the interface 448 between the first coupling-dielectric material layer 430 and the second coupling-dielectric material layer 444 may be reduced by the CMP-process. However, the interface 448 in the upper part of the floating-gate electrodes 442 is there after the CMP-process.

Figure 4I:
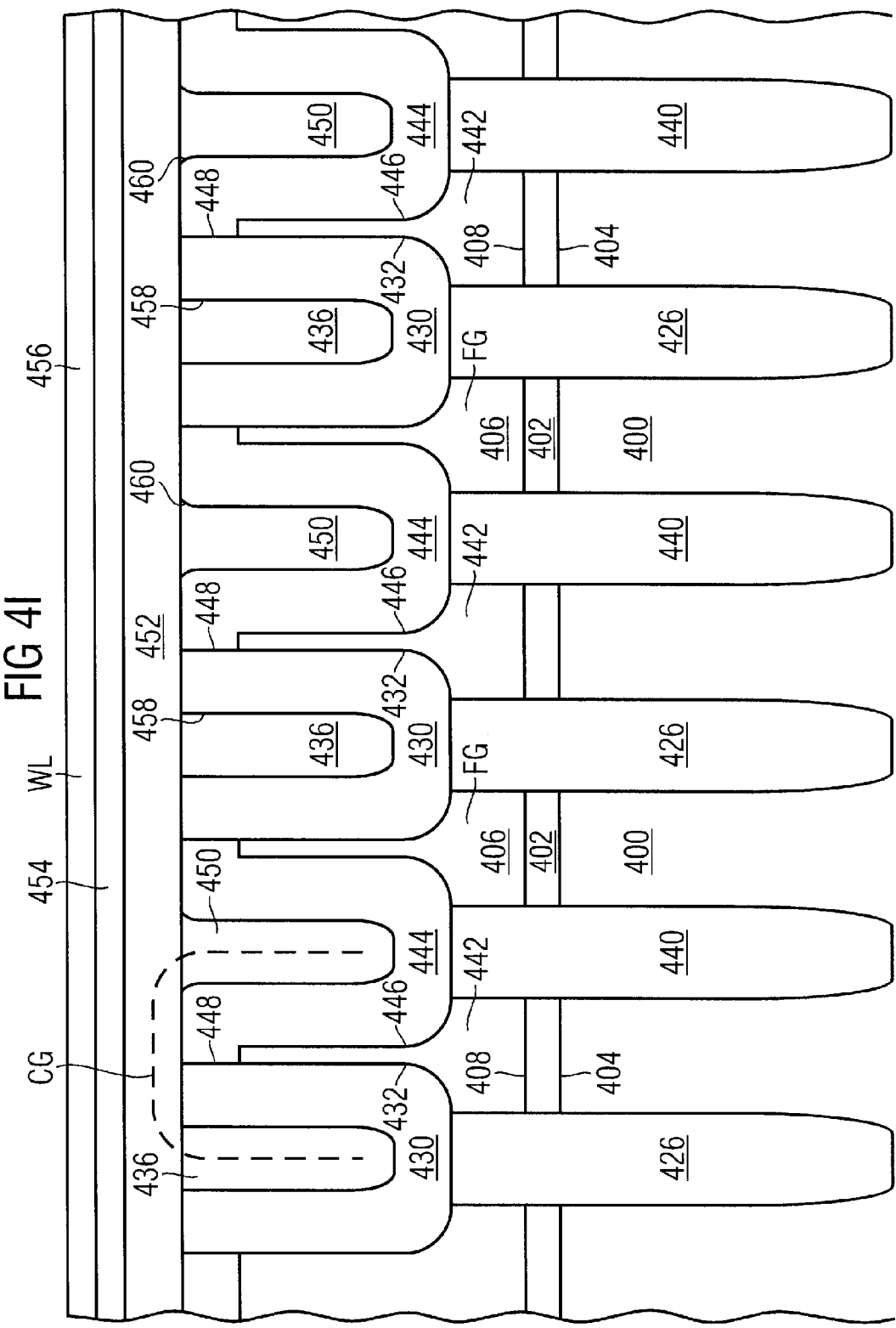

FIG. 4I shows a cross-sectional view of the semiconductor substrate 400 having a first top layer 452 deposited on the semiconductor substrate 400. The first top layer 452 may include polysilicon or another appropriate material.

The first top layer 452 is deposited to form together with the layers 436 and 450 control-gate electrodes CG. Therefore, the first top layer 452 is in contact with contact regions 458 of layer 430 and contact regions 460 of layer 444. The contact regions 458 and 460 are arranged in the upper part of the layers 430 and 444. The first top layer 452 also covers the interfaces 448 between the two layers 430 and 444.

The contact regions 458 and 460 may have a different shape. For example, the contact regions 458 may have a curvature with a first average radius of curvature and the contact regions 460 may have a curvature with a second average radius of curvature. The first average radius of curvature may be smaller than the second average radius of curvature.

A second top layer 454 and a third top layer 356 are deposited on the first top layer 452. As an example, the second top layer 454 and the third top layer 356 may comprise tungsten nitride and tungsten. In this case, the second top layer 454 is a barrier to prevent the tungsten of the third top layer 356 from diffusing into the first top layer 452 of polysilicon.

However, this technology is not limited to the materials tungsten nitride and tungsten for the top layers 454 and 356 to form a wordline WL connected to the plurality of control-gate electrodes CG.

FIGS. 5A to 5G show cross-sectional views of a semiconductor device to describe another approach of an implementation of a method for forming floating-gate electrodes.

Figure 5A:
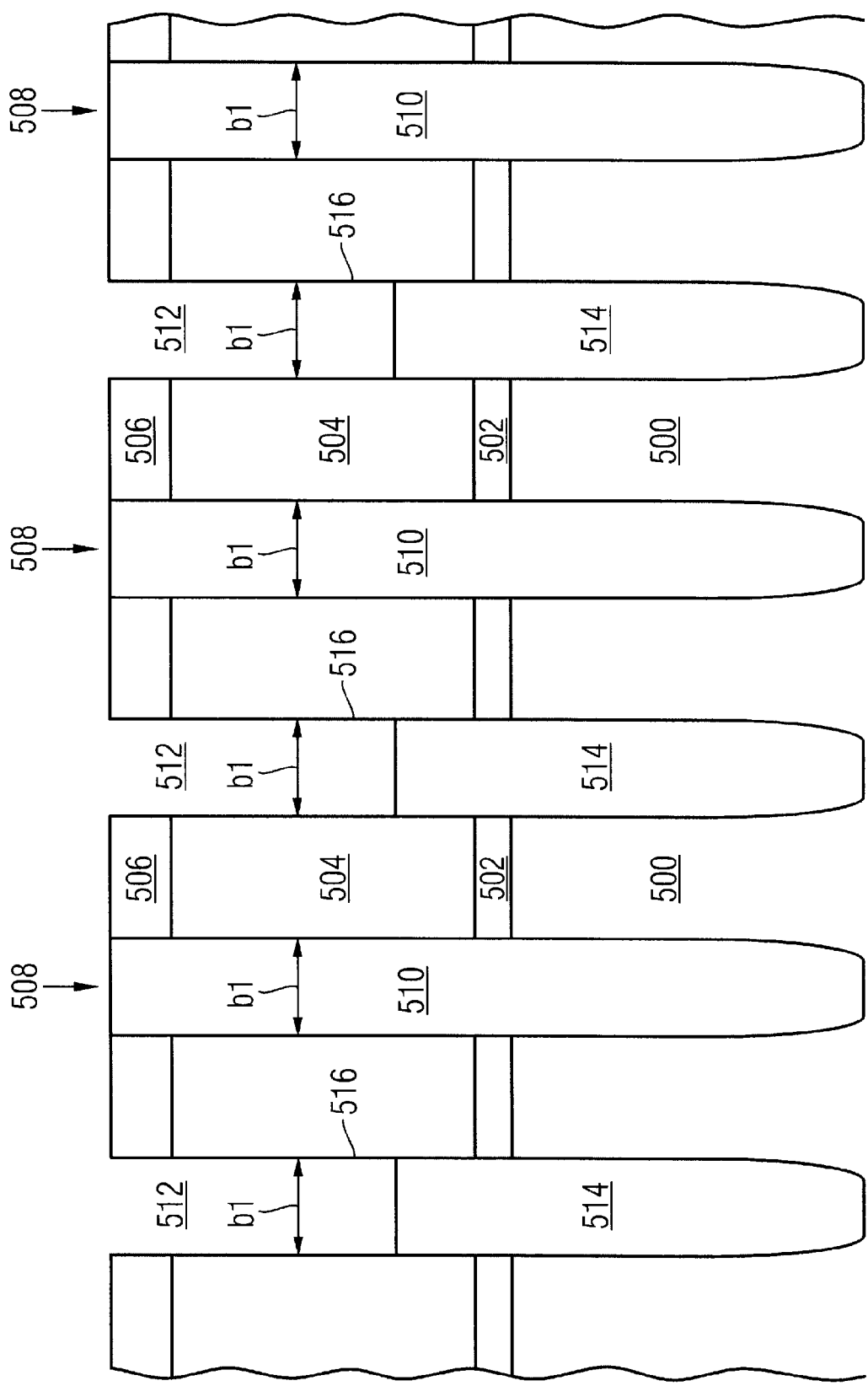

In FIG. 5A, a cross-sectional view of a semiconductor substrate 500 is shown. In accordance with the process steps described above with regard to FIG. 4A, an insulation layer 502, a floating-gate layer 504 and a nitride layer 506 are formed on the semiconductor substrate 500. A first plurality of trenches 508 is etched into the semiconductor substrate 500 with the layers 502 to 506. For instance, a RIE process is performed to etch the first plurality of trenches 508 with a first breadth b1.

Each trench 508 is filled with an insulating material 510. Thus, STI-trenches are provided within the semiconductor substrate 500. A CMP-process may be performed to remove the insulating material 510 protruding out of the trenches 503.

A second plurality of trenches 512 is etched into every second trench of the first plurality of trenches 508. Thus, two adjacent trenches of the second plurality of trenches 512 may embrace one trench 508 of the first plurality of trenches, which is still filled completely with the insulating material 510.

The trenches 512 may have the same breadth b1 as the trenches 508. However, the surface of the remaining STI-fills 514 is reduced by the second plurality of trenches 512. For instance, a RIE process may be performed to etch the second plurality of trenches 512.

The trenches 512 are etched to shape first side walls 516 of the floating-gate electrodes later to be formed. The first side walls 516 are arranged parallel to the longitudinal direction of the trenches filled with the insulating material 510 and 514.

Figure 5B:
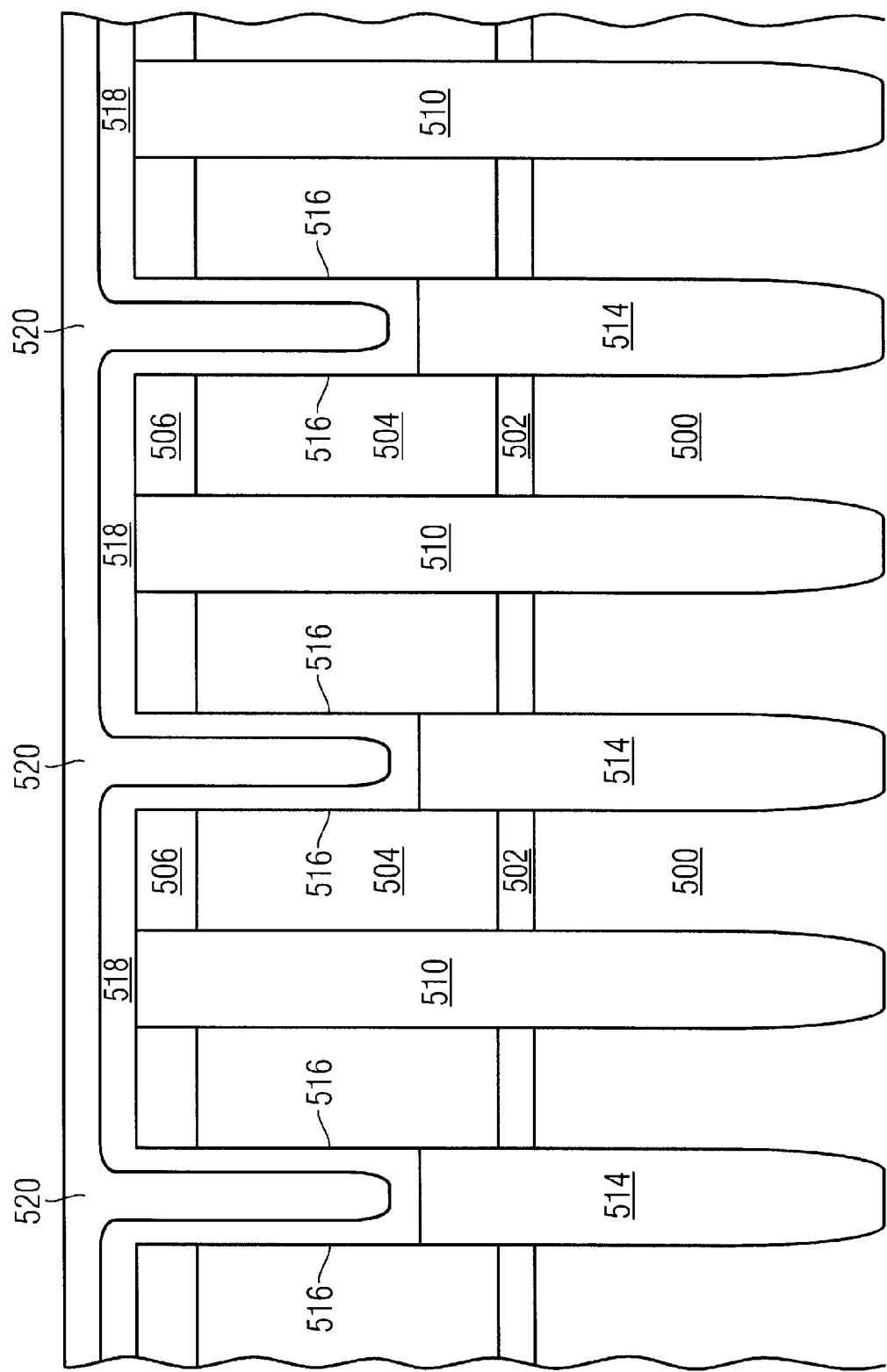

The first side walls 516 are covered by a first coupling-dielectric material layer 518 and a first layer of material for the control-gate electrodes 520. The layers 518 and 520 may be deposited by a LPCVD process. For instance, the first coupling-dielectric material layer 518 may include silicon oxide. However, the present technology is not restricted to this material. The result is shown in FIG. 5B.

FIG. 5C shows a cross-sectional view of semiconductor substrate 500 after a CMP-process is performed to remove protruding parts of the layers 518 and 520. The CMP-process is performed until the nitride layer 506 is exposed again.

Figure 5D:
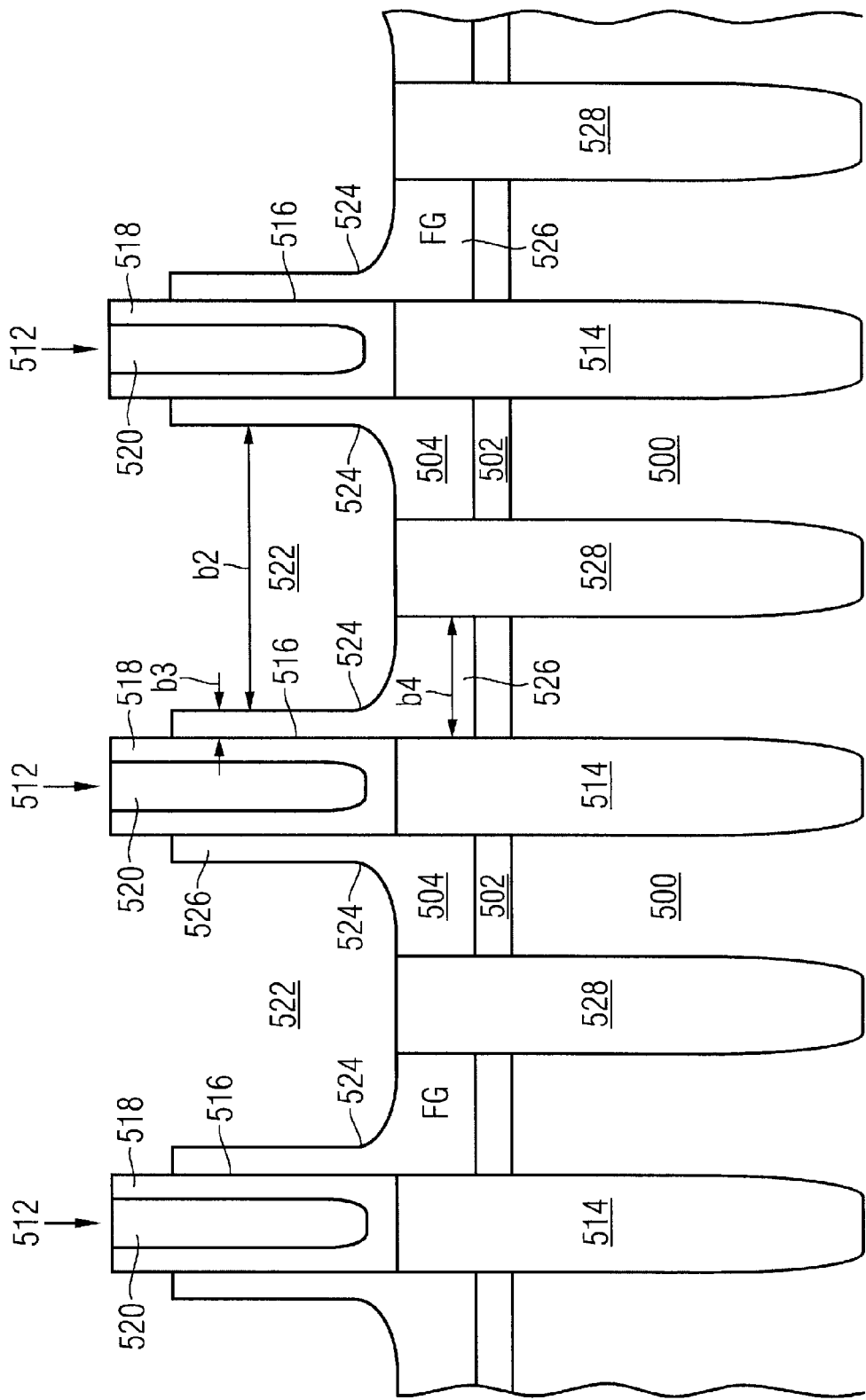

FIG. 5D shows a cross-sectional view of semiconductor substrate 500 after an etching of a third plurality of trenches 522 to shape a second side wall 524 of the floating-gate electrodes 526. The third plurality of trenches 522 is etched into the remaining trenches of the first plurality of trenches. After the etching of the third plurality of trenches 522, two trenches 522 may embrace one trench 512 of the second plurality of trenches 512.

The third plurality of trenches 522 may be etched by an isotropic etch process. This isotropic etch process may be performed until the surface of the remaining STI-fills 528 has the same height as the STI-fills 514. The breadth b2 of the trenches 522 may be larger that the breadth b1 of the trenches 508 and 512.

During the etching of the third plurality of trenches 522, floating-gate electrodes FG 526 are formed of the former floating-gate layer 504. Each floating-gate electrode 526 has one first side wall 516 and one second side wall 524. The first side wall 516 may have a different shape than the second side wall 524. For instance, the first side wall may have a first curvature with a first radius of curvature and the second side wall may have a second curvature with a second radius of curvature, wherein the second radius of curvature has a different value than the first radius of curvature. In the example shown in FIG. 5D, the first side wall 516 is almost flat while the second side wall 524 has a curvature.

The floating-gate electrodes 526 may have a L-shape. Each floating-gate electrode 526 may have an upper breadth b3 which is smaller than its lower breadth b4. The upper breadth b3 may be about 10 nm. The lower breadth b4 of the floating-gate electrodes 526 may be in the range between 30 nm to 100 nm.

The L-shape of the floating-gate electrodes 526 may reduce the interaction between two floating-gate electrodes 526 arranged next to each other in a direction perpendicular to the cross-section of the FIGS. 5A to 5G. The interaction between a floating-gate electrode 526 and its associated (in a following process step to be formed) control-gate electrode is not limited by the inverse L-shape of the floating-gate electrodes 526.

The second side walls 524 are covered with a second coupling-dielectric material layer 530 and a second layer of material for the control-gate electrodes 532. Thus, an interface 534 is formed between the first coupling-dielectric material layer 518 and the second coupling-dielectric material layer 530. The result is shown in FIG. 5E.

The second coupling-dielectric material layer 530 may have a different layer thickness than the first coupling-dielectric material layer 518. Furthermore, the layer thickness of the second layer of material for the control-gate electrodes 532 may be different from the layer thickness of the first layer of material for the control-gate electrodes 520.

The layers 530 and 532 may also include different materials than the layers 518 and 520. For instance, the second coupling-dielectric material layer 530 may include a high-k material.

Layers formed of a high-k material may be sensitive to electrical field intensity. However, the increased breadth b2 of the third plurality of trenches 522 makes it possible to form a layer 530 of a high-k material within the trenches 522, wherein the layer 530 has an increased layer thickness compared with the first coupling-dielectric material layer 518.

The layer 530 of a high-k material may provide a good capacitive coupling between each floating-gate electrode 526 and its associated control-gate electrodes (later to be formed). The layers 518 and 520 may be formed to provide an electrical shielding between two adjacent floating-gate electrodes 526.

Figure 5F:
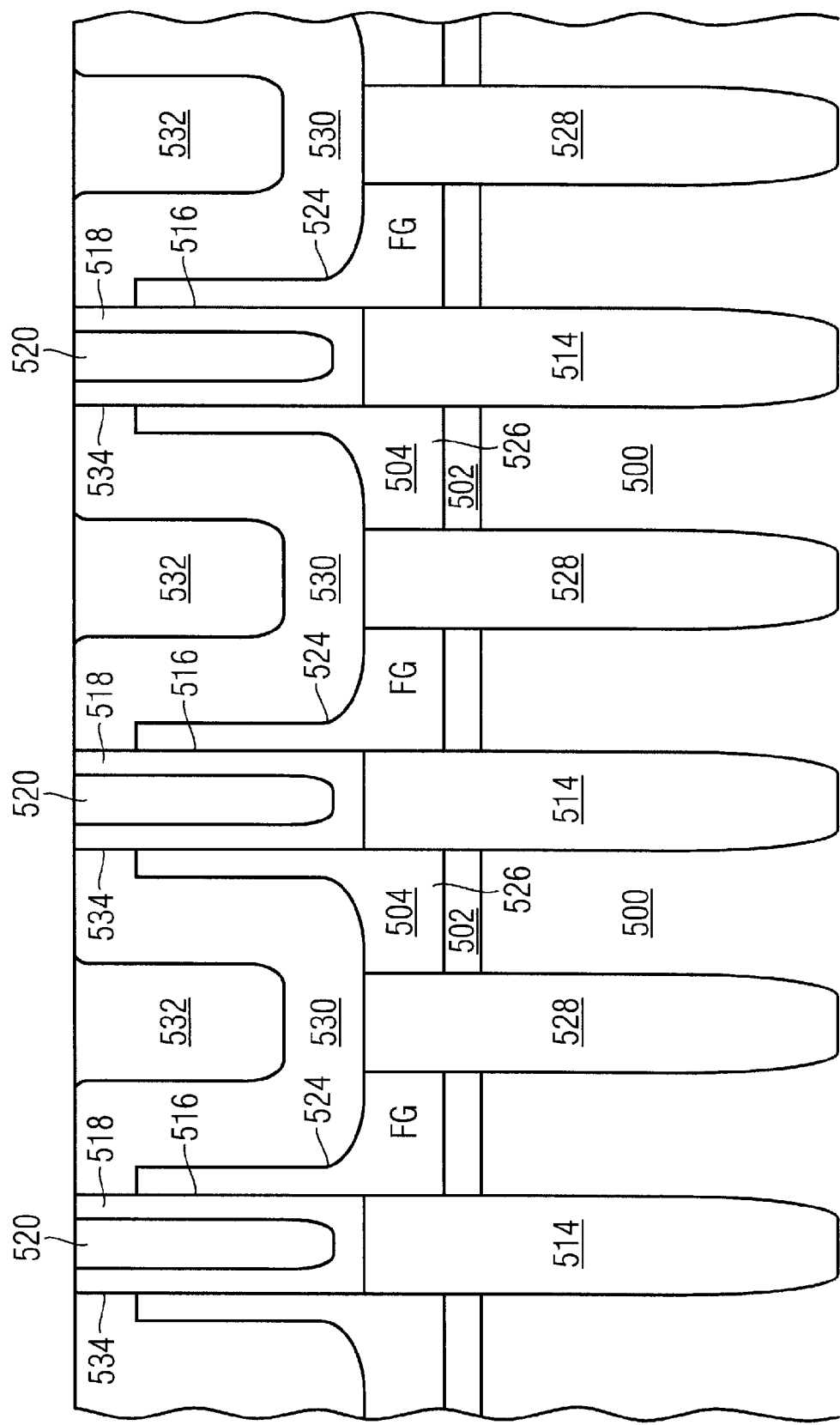

In FIG. 5F, a cross-sectional view of the semiconductor substrate 500 after a CMP-process is shown. During the CMP-process, the protruding parts of the layers 530 and 532 are removed.

In accordance with the process steps described with regard to FIG. 4I, a first top layer 536, a second top layer 538 and a third top layer 540 are deposited on the layers 518, 520, 530 and 532.

The first top layer 536 also covers the interfaces 534 and the contact regions 542 and 544 of the layers 520 and 532. As described above, the contact regions 542 and 544 may have a different shape. For instance, the contact regions 542 of layer 520 may almost be flat while the contact regions 544 of layer 532 may have a curvature.

While various embodiments of the invention have been described, it will be apparent to those of ordinary skill in the art that many more embodiments and implementations are possible that are within the scope of this invention.

What is claimed is:

1. A method for forming floating-gate electrodes on a semiconductor substrate, the method comprising:

depositing a layer of dielectric material on a surface of the semiconductor substrate;

depositing a layer of material for floating-gate electrodes on the layer of dielectric material;

etching a first plurality of trenches;

filling the first plurality of trenches at least partially with an insulating material to form insulation trenches;

etching a second plurality of trenches to shape a first side wall of a plurality of floating-gate electrodes, the first side wall running parallel to the longitudinal direction of the insulation trenches;

covering the first side wall at least partially with a first layer; and etching a third plurality of trenches to shape a second side wall of the plurality of floating-gate electrodes, so that each floating-gate electrode of the plurality of floating-gate electrodes comprises one first side wall and one second side wall opposing the first side wall.

2. The method of claim 1, wherein the second side wall is covered at least partially with a second layer such that an interface is formed between the first layer and the second layer.

3. The method of claim 1, wherein the trenches of the third plurality of trenches are etched wider than the trenches of the second plurality of trenches.

4. The method of claim 1, wherein etching the second plurality of trenches includes utilizing a reactive ion etch ("RIE") process.

5. The method of claim 1, wherein etching the third plurality of trenches includes utilizing an isotropic etch process.

6. The method of claim 1, wherein each trench of the second plurality of trenches is etched into every second trench of the first plurality of trenches.

7. The method of claim 6, wherein each trench of the third plurality of trenches is etched such that two adjacent trenches of the second plurality of trenches embrace one trench of the third plurality of trenches.

8. The method of claim 1, wherein the first layer comprises a first coupling-dielectric material, and wherein the first layer is covered at least partially with a first layer of material for the control-gate electrodes.

9. The method of claim 8, wherein the second layer comprises a second coupling-dielectric material, and wherein the second layer is covered at least partially with a second layer of material for the control-gate electrodes.

10. The method of claim 9, wherein the first coupling-dielectric material differs from the second coupling-dielectric material.

* * * * *